(12) United States Patent
Zhou et al.

(10) Patent No.: US 11,721,994 B2
(45) Date of Patent: Aug. 8, 2023

(54) METHOD AND SYSTEM FOR OPTIMIZING CHARGING AND DISCHARGING BEHAVIORS OF A BATTERY ENERGY STORAGE SYSTEM BASED ON STATE OF HEALTH

(71) Applicant: Hefei University of Technology, Anhui (CN)

(72) Inventors: Kaile Zhou, Anhui (CN); Zenghui Zhang, Anhui (CN); Shanlin Yang, Anhui (CN); Jianling Jiao, Anhui (CN); Xinhui Lu, Anhui (CN)

(73) Assignee: Hefei University of Technology, Hefei (CN)

( * ) Notice: Subject to any disclaimer, the term of this patent is extended or adjusted under 35 U.S.C. 154(b) by 352 days.

(21) Appl. No.: 17/230,952

(22) Filed: Apr. 14, 2021

(65) Prior Publication Data
US 2021/0234387 A1    Jul. 29, 2021

(30) Foreign Application Priority Data

Feb. 10, 2021   (CN) .......................... 202110183907.6

(51) Int. Cl.
*H02J 7/00* (2006.01)
*G01R 31/392* (2019.01)
*G01R 31/382* (2019.01)

(52) U.S. Cl.
CPC .......... *H02J 7/0048* (2020.01); *G01R 31/382* (2019.01); *G01R 31/392* (2019.01); *H02J 7/005* (2020.01)

(58) Field of Classification Search
CPC ........ H02J 7/0048; H02J 7/005; H02J 7/0025; H02J 7/0013; G01R 31/382; G01R 31/392; G01R 31/371; G01R 31/387
See application file for complete search history.

(56) References Cited

U.S. PATENT DOCUMENTS

| | | | |
|---|---|---|---|
| 2016/0226268 A1* | 8/2016 | Okui | H02J 7/0071 |
| 2020/0067146 A1* | 2/2020 | Tang | H01M 10/441 |
| 2020/0081070 A1* | 3/2020 | Chemali | G01R 31/367 |
| 2021/0311129 A1* | 10/2021 | Yezerets | G01R 31/392 |
| 2021/0339650 A1* | 11/2021 | Hashimoto | B60L 58/12 |
| 2022/0115897 A1* | 4/2022 | Ijaz | H02J 7/0048 |
| 2022/0289065 A1* | 9/2022 | Matsuda | B60L 53/66 |

FOREIGN PATENT DOCUMENTS

| | | |
|---|---|---|
| CN | 106451508 A | 2/2017 |
| CN | 104795831 B | 8/2017 |
| CN | 110544950 A | 12/2019 |

* cited by examiner

*Primary Examiner* — Stacy Whitmore

(57) ABSTRACT

Provided are a method and a system for optimizing charging and discharging behaviors of a BESS based on a SOH, relating to charging and discharging optimization. The number of cycles of the battery pack and corresponding DODs are obtained based on the curve of the SOC of the battery pack. Then, the SOH of the battery pack is obtained. A charging index sequence and a discharging index sequence of battery packs are obtained based on the SOH, the SOC and a charging and discharging state of the battery pack. The optimal number of the charging and discharging battery packs and optimal DODs are determined. Charging and discharging tasks are carried out according to the charging and discharging index sequences of the battery packs based on the optimal number of the charging and discharging battery packs and the optimal DODs.

10 Claims, 3 Drawing Sheets

METHOD AND SYSTEM FOR OPTIMIZING CHARGING AND DISCHARGING BEHAVIORS OF A BATTERY ENERGY STORAGE SYSTEM BASED ON STATE OF HEALTH

CROSS-REFERENCE TO RELATED APPLICATIONS

This application claims the benefit of priority from Chinese Patent Application No. 202110183907.6, filed on Feb. 10, 2021. The content of the aforementioned application, including any intervening amendments thereto, is incorporated herein by reference in its entirety.

TECHNICAL FIELD

The present application relates to charging and discharging optimization, in particular to a method and a system for optimizing charging and discharging behaviors of a battery energy storage system (BESS) based on state of health (SOH).

BACKGROUND

In case of determined total system capacity and investment cost, the value of a battery energy storage system (BESS) is greatly dependent on its service life. Currently, the most reasonable and effective way to reduce the loss and prolong the service life is to optimize and control charging and discharging behaviors of battery packs in the BESS.

In the prior art, the charging and discharging behaviors of the BESS are optimized mainly based on the state of charge (SOC) of the battery; the state of health (SOH); or two or three of the SOH, the depth of discharge (DOD), the SOC, the number of switching times of charging and discharging states and the charging and discharging capacity of the battery pack in the BESS.

However, if the BESS is optimized only based on the SOC of the battery, the aging speeds of battery packs in the BESS will be different, which greatly shortens the service life of the BESS. If the optimization is performed only based on the SOH of the batteries, new batteries will frequently be in the deep charging and discharging processes, which is not conducive to the optimal operation of the BESS. Therefore, the existing optimization technology cannot achieve the overall optimization of the BESS.

SUMMARY

An object of the present disclosure is to provide a method and a system for optimizing the charging and discharging behaviors of a BESS based on SOH to overcome the defect in the prior art that it fails to achieve the overall optimization for the BESS.

In order to achieve the above objectives, the present disclosure adopts the following technical solutions.

In a first aspect, the present disclosure provides a method for optimizing charging and discharging behaviors of a BESS based on SOH, comprising:

determining an output power of the BESS based on electric power data; and obtaining a curve of a SOC of each of battery packs based on the output power of the BESS;

obtaining the number of cycles of each of the battery packs and DODs corresponding to the cycles of each of the battery packs based on the curve of the SOC of each of the battery packs;

obtaining the SOH of each of the battery packs based on the number of cycles of each of the battery packs and the DODs corresponding to the cycles of each of the battery packs;

obtaining a charging index sequence and a discharging index sequence of the battery packs based on the SOH, the SOC and a charging and discharging state of each of the battery packs;

determining the optimal number of charging and discharging battery packs and DODs corresponding to the charging and discharging battery packs based on the number of cycles of each of the battery packs and the DODs corresponding to the cycles of each of the battery packs; and carrying out charging and discharging tasks according to the charging index sequence and the discharging index sequence based on the optimal number of the charging and discharging battery packs and DODs corresponding to the charging and discharging battery packs.

In some embodiments, the step of "obtaining the number of cycles of each of the battery packs and the DODs corresponding to the cycles of each of the battery packs based on the curve of the SOC of each of the battery packs" comprises:

obtaining the number of cycles of each of the battery packs and the DODs corresponding to the cycles of each of the battery packs based on the curve of the SOC of each of the battery packs using a cycle counting method, wherein the cycle counting method comprises a rain-flow counting method.

In some embodiments, the step of "obtaining the SOH of each of the battery packs based on the number of cycles of each of the battery packs and the DODs corresponding to the cycles of each of the battery packs" comprises:

obtaining the number of end-of-life cycles of each of the battery packs under different DODs and the number of cycles of an equivalent loss based on the number of cycles of each of the battery packs;

obtaining a total loss value of each of the battery packs based on the end-of-life cycles and the number of cycles of the equivalent loss; and obtaining the SOH of each of the battery packs based on the total loss value of each of the battery packs.

In some embodiments, the step of "obtaining the charging index sequence and the discharging index sequence of the battery packs based on the SOH, the SOC and a charging and discharging state of each of the battery packs" comprises:

calculating SOCs of the battery packs, and normalizing the SOCs and SOHs of the battery packs;

grouping the battery packs according to the charging and discharging state of the each of the battery packs; and numbering the battery packs based on the normalized SOCs and SOHs of the battery packs and the charging and discharging state of each of the battery packs; and determining the charging index sequence and the discharging index sequence according to numbers of the battery packs in a descending order.

In some embodiments, the step of "determining the optimal number of the charging and discharging battery packs and DODs corresponding to the charging and discharging battery packs based on the number of cycles of each of the battery packs and the DODs corresponding to the cycles of each of the battery packs" comprises:

taking a minimum sum of the life loss value of the battery packs as an objective function, determining the optimal number of the charging and discharging battery packs and the DODs corresponding to the charging and discharging battery packs based on the number of cycles of each of the battery packs and the DODs corresponding to the cycles of each of the battery packs using a heuristic algorithm.

In a second aspect, the present disclosure provides a system for optimizing charging and discharging behaviors of a BESS based on a SOH, comprising:

a data acquisition module, configured to acquire electric power data;

a data processing module, configured to determine an output power of the BESS based on the electric power data, obtain a curve of a SOC of each of the battery packs based on the output power of the BESS, obtain the number of cycles of each of the battery packs and DODs corresponding to the cycles of each of the battery packs based on the curve of the SOC of each of the battery packs, obtain the SOH of each of the battery packs based on the number of cycles of each of the battery packs and the DODs corresponding to the cycles of each of the battery packs, and obtain a charging index sequence and a discharging index sequence of the battery packs based on the SOH, the SOC, a charging and discharging state of each of the battery packs;

an optimization and scheduling module, configured to determine the optimal number of the charging and discharging battery packs and DODs corresponding to the charging and discharging battery packs based on the number of cycles of each of the battery packs and the DODs corresponding to the cycles of each of the battery packs; and a behavior adjustment module, configured to perform charging and discharging tasks of the battery packs according to the charging index sequence and the discharging index sequence based on the optimal number of the charging and discharging battery packs and the DODs corresponding to the charging and discharging battery packs.

In some embodiments, in the data processing module, the number of cycles of each of the battery packs and the DODs corresponding to the cycles of each of the battery packs are obtained based on the curve of the SOC of each of the battery packs using a cycle counting method, wherein the cycle counting method comprises a rain-flow counting method.

In some embodiments, in the data processing module, based on the number of cycles of each of the battery packs and the DODs corresponding to the cycles of each of the battery packs, the SOH of each of the battery packs is obtained through steps that:

the number of end-of-life cycles of each of the battery packs under different DODs and the number of cycles of an equivalent loss are obtained based on the number of cycles of each of the battery packs;

a total loss value of each of the battery packs is obtained based on the end-of-life cycles and the number of cycles of the equivalent loss; and the SOH of each of the battery packs is obtained based on the total loss value of each of the battery packs.

In some embodiments, in the data processing module, based on the SOH, the SOC and a charging and discharging state of each of the battery packs, the charging index sequence and the discharging index sequence of the battery packs are obtained through steps that:

SOCs of the battery packs are calculated, and the SOCs and SOHs of the battery packs are normalized; and the battery packs are grouped according to the charging and discharging state of each of the battery packs; the battery packs are numbered based on the normalized SOCs and SOHs of the battery packs and the charging and discharging state of each of the battery packs; and the charging index sequence and the discharging index sequence are determined according to numbers of the battery packs in a descending order.

In some embodiments, in the optimization and scheduling module, taking a minimum sum of the life loss value of the battery packs as an objective function, the optimal number of the charging and discharging battery packs and the DODs corresponding to the charging and discharging battery packs are determined based on the cycles of each of the battery packs and the DODs corresponding to the cycles of each of the battery packs using a heuristic algorithm.

Compared to the prior art, the present disclosure has the following beneficial effects.

The power data is obtained to determine the output power of the BESS, and the curve of the SOC of each of the battery packs is determined. The number of cycles of each of the battery packs and the DODs corresponding to the cycles of each of the battery packs are obtained according to the historical curve of the SOC of each of the battery packs, and then SOH of each of the battery packs is obtained according to the number of cycles of each of the battery packs and the DODs corresponding to the cycles of each of the battery packs. The charging index sequence and the discharging index sequence of the battery packs are determined through the SOHs of the battery packs, the SOCs of the battery packs and the charging and discharging states of the battery packs. Finally, the optimal number of charging and discharging battery packs and the corresponding optimal DODs are determined, and charging and discharging tasks of the battery packs are carried out according to the optimal number of the charging and discharging battery packs and the optimal DODs, and the index sequences. The technical solutions of the present disclosure comprehensively consider the maximum number of cycles of each of the battery packs, the DOD and the total number of discharge cycles when calculating the SOH of the BESS, which meets the requirements of actual charging and discharging processes. At the same time, the SOH, the SOC, and the charging and discharging states of the battery packs are comprehensively considered when determining the charging index sequence and the discharging index sequence of the battery packs, and finally the charging and discharging tasks are carried out according to the obtained optimal number of charging and discharging battery packs and the corresponding optimal DODs, and the index sequences, which minimizes the behavior that shortens the service life of the battery, thus realizing the overall optimization of the BESS.

BRIEF DESCRIPTION OF THE DRAWINGS

In order to explain the technical solutions in the embodiments of the present disclosure more clearly, the following will briefly introduce the accompanying drawings. Obviously, the drawings in the following description are only some embodiments of the present invention. For those of ordinary skill in the art, other drawings can be obtained based on these drawings without sparing creative work.

DETAILED DESCRIPTION OF EMBODIMENTS

Figure 1:
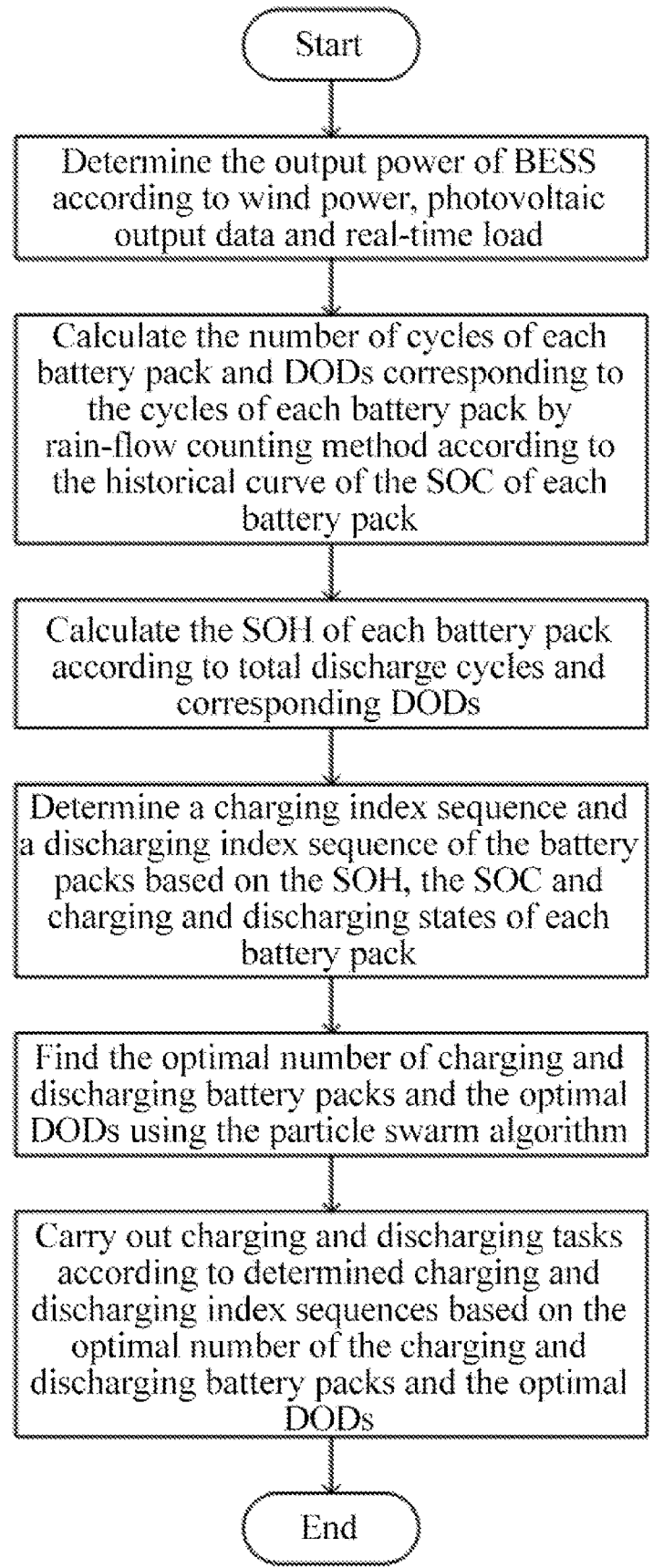
FIG. 1 is a schematic diagram of a method for optimizing charging and discharging behaviors of a BESS based on a SOH according to an embodiment of the present disclosure.

The present disclosure will be described in detail in the following embodiments, from which objects, technical solutions and advantages of the present disclosure will be clearer. Obviously, the described embodiments are some embodiments of the present disclosure. Based on the embodiments of the present disclosure, all other embodiments obtained by those of ordinary skill in the art without sparing creative work shall fall within the protection scope of the present disclosure.

The embodiment provides a method and a system for optimizing charging and discharging behaviors of a BESS based on a SOH, which solves the problem that the prior art fails to achieve overall optimization for the BESS.

In order to solve the above technical problems, this embodiment adopts the following technical solutions.

In order to minimize the behavior that shortens the battery life so as to realize the overall optimization of BESS, the present disclosure comprehensively considers the maximum number of cycles of the battery pack, DOD, and the total number of discharge cycles in the calculation model of the SOH of the BESS, which considers the fact that the frequent switching of charging and discharging states will increase the loss of the battery pack. In addition, the SOH, the SOC, and the charging and discharging state of the battery pack are comprehensively considered when determining a charging index sequence and a discharging index sequence of the battery packs, and the charging index sequence and the discharging index sequence are determined according to the SOHs, the SOCs, a charging and discharging state. The heuristic algorithm is adopted to determine an optimal number of charging and discharging battery packs, and corresponding optimal DODs. Finally, the charging and discharging tasks are carried out according to the optimal number of charging and discharging battery packs and the corresponding optimal DODs.

The above technical solutions will be described in detail below in conjunction with the accompanying drawings and the embodiments, from which technical solutions of the present disclosure will be better understood.

In order to facilitate the understanding, relevant terms and concepts are explained as follows.

Depth of discharge (DOD): it refers to the percentage of the power discharged from the battery to a rated capacity of the battery.

State of health (SOH): it refers to the percentage of the current storage capacity of the battery to the storage capacity of the new battery.

State of charge (SOC): the SOC of a battery or a single cell refers to a ratio of its available charge at a specified moment to the available charge in a fully charged state. SOC is expressed as a percentage; 100% means the state of charge is full; and 0 means the state of charge is empty.

Embodiment 1

The present disclosure provides a method for optimizing charging and discharging behaviors of a BESS based on a SOH, including the following steps.

S1) An output power of the BESS is determined based on electric power data, and a curve of a SOC of each of battery packs are obtained based on the output power of BESS.

S2) The number of cycles of each of the battery packs and DODs corresponding to the cycles of each of the battery packs are obtained based on the curve of the SOC of each of the battery packs.

S3) The SOH of each of the battery packs is obtained based on the number of cycles of each of the battery packs and the DODs corresponding to the cycles of each of the battery packs.

S4) A charging index sequence and a discharging index sequence of the battery packs are obtained based on the SOH, the SOC and a charging and discharging state of each of the battery packs.

S5) The optimal number of charging and discharging battery packs and DODs corresponding to the charging and discharging battery packs are obtained based on the number of cycles of each of the battery packs and the DODs corresponding to the cycles of each of the battery packs.

S6) Charging and discharging tasks are carried out according to the charging index sequence and the discharging index sequence of the battery packs based on the optimal number of the charging and discharging battery packs and the DODs corresponding to the battery packs.

It can be seen that the SOH of the BESS is calculated by comprehensively considering the maximum number of cycles, the DOD and the total number of discharge cycles of each of the battery packs. At the same time, the SOH, the SOC, and the battery charging and discharging state are comprehensively considered when determining the charging index sequence and the discharging index sequence of the battery packs. Finally, the charging and discharging tasks are carried out according to the optimal number of the charging and discharging battery packs, the optimal DODs corresponding to the battery packs, and the charging index sequence and the discharging index sequence of the battery packs. This minimizes behaviors that shorten the service life of the battery, thus realizing the overall optimization of the BESS.

In an embodiment, in order to obtain a more accurate number of the cycles of the battery pack and DODs corresponding to the cycles of the battery pack, a preferred method is to obtain the number of the cycles of the battery pack and the corresponding DODs based on the curve of the SOC of the battery pack. Specifically, the number of the cycles of the battery pack and the corresponding DODs are obtained using a cycle counting method based on a historical curve of the SOC of the battery pack. The cycle counting method includes the rain-flow counting method.

In order to comply with the actual situation that the frequent switching of charging and discharging states in practical situations will increase the loss of the battery pack to obtain a more accurate SOH of the battery pack, a preferred method is to obtain the SOH of the battery pack based on the number of cycles of the battery pack and the corresponding DODs, which includes the following steps.

S31) The number of life-of-end cycles and the number of cycles of an equivalent loss of the battery pack under different DODs are obtained based on the number of cycles of the battery pack.

S32) A total loss value of the battery pack is obtained based on the number of life-of-end cycles and the number of cycles of the equivalent loss.

S33) The SOH of the battery pack is obtained based on the total loss value of the battery pack.

In addition, in order to minimize the behavior that shortens the service life of the battery, the SOH, the SOC and the charging and discharging state of the battery pack are comprehensively considered when determining the charging index sequence and the discharging index sequence of the battery packs. A preferred method is to obtain the charging index sequence and the discharging index sequence of the battery pack based on the SOH, the SOC and the charging and discharging state of the battery pack, which specifically includes the following steps.

The SOCs of all battery packs are calculated, and the SOCs and the SOHs of the battery packs are normalized.

All battery packs are grouped according to the charging and discharging state, and all battery packs are numbered based on the normalized SOCs and SOHs of the battery packs and the charging and discharging states of the battery packs.

The charging index sequence and the discharging index sequence of the battery packs are determined according to a descending order.

In addition, in order to meet the requirements of charging and discharging while minimizing the behavior that shortens the service life of the battery, a preferred method is to take a minimum sum of the life loss value of all battery packs as an objective function and determine the optimal number of charging and discharging battery packs and the DODs corresponding to the charging and discharging battery packs using the heuristic algorithm based on the number of cycles of the each of the battery packs and the DODs corresponding to the cycles of each of the battery packs.

S1-S4 are described in detail as follows to illustrate an embodiment of the present disclosure. Referring to FIG. 1, the method for optimizing charging and discharging behaviors of the BESS based on the SOH includes the following steps.

S1) The output power of the BESS is determined based on the electric power data, and the curve of the SOC of the battery pack is obtained based on the output power of the BESS.

The output power of the BESS is determined according to wind power, photovoltaic output data and real-time load data, and grid transaction data. The output power of the BESS is the total output power of all battery packs, i.e., the power value that meets the requirement. Assuming that the power generated by a wind turbine is $P_{WT}$, the power generated by a photovoltaic system is $P_{PV}$, the total power of the load of the BESS is $P_E$, and the power sold to the state grid is $P_{OUT}$ the output power of the BESS is:

$$P=P_{WT}+P_{PV}-P_E-P_{OUT}.$$

When the output power of the BESS is positive, the BESS is in the state of charge. When the output power of the BESS is negative, the BESS is in the state of discharge.

A curve of the SOC of each battery pack is depicted according to the power obtained by each battery pack in the BESS, and the curves of the SOCs of different battery packs are depicted according to respective assigned power values. Specifically, the horizontal axis of the coordinate represents time; the vertical axis represents the SOC of the battery pack; and the curve of the SOC of each battery pack is plotted by taking the power of each battery pack at different moments as slopes of the curve. The curve of the SOC of each battery pack changes over time.

S2) The number of cycles of each battery pack and DODs corresponding to the cycles of each battery pack are obtained based on the curve of the SOC of each battery pack.

According to the historical curve of the SOC of each battery pack, the number of cycles and the DODs corresponding to the cycles of each battery pack are calculated by the cycle counting method. Specifically, the number of cycles of each battery pack and the corresponding DODs are calculated using the rain flow counting method.

The rain-flow counting method (also called the spire method), referred to as the rain-flow method, is a kind of cycle counting method. It is capable of calculating all load cycles based on the load history. The time history of the load is drawn as a line graph, and then the coordinate system is rotated for 90 degrees to make the time axis extend downward vertically. The data records are taken as a series of "roofs", different load cycles are determined according to the trajectory of raindrops flowing downwards, so as to calculate the amplitude of the full cycle and the frequency corresponding to the amplitude respectively. As a kind of energy storage material, the battery regards the DOD, the number of cycles of charging and discharging, the charging and discharging current in the charging and discharging process of the battery as the load when calculating the fatigue life of the energy storage material, and the amplitude and corresponding times of the load, i.e., the DOD and corresponding times of the BESS in the charging and discharging history, can be obtained through calculations. Based on the above analysis, the rain flow counting method can be adopted to calculate the number of cycles of each battery pack in the BESS and the DODs corresponding to the cycles of each battery pack in the BESS. Specifically, the number of cycles and the corresponding DODs are calculated as follows.

The DOD is the ratio of the discharge capacity of the battery to its rated capacity in a complete charging and discharging cycle including a charging cycle and a discharging cycle. The DOD of the battery can be directly calculated by the SOC of the charged battery and the SOC of the discharged battery, that is, the difference between the peak of the SOC after the battery is charged and the valley of the SOC after the battery is discharged.

The curve of the SOC of each battery pack is drawn through the history record of the charging and discharging of the BESS, and the number of cycles of each battery pack and the corresponding DODs are obtained by the rain flow counting method.

S3) The SOH of each battery pack is obtained based on the number of cycles of each battery pack and the corresponding DODs, which specifically includes the following steps.

S31) The number of life-of-end cycles and the number of cycles of an equivalent loss of the battery pack under different DODs are obtained based on the number of cycles of the battery pack.

The number of life-of-end cycles under different DODs of the battery is calculated as follows:

$$N_{life,i,j}=N_0(DOD_{i,j})^{-kp};$$

where, $N_{life,i,j}$ is the number of cycles of the battery pack under a specific DOD; $N_0$ is the number of cycles of the battery pack under the DOD of 100%; $DOD_{i,j}$ is the DOD of the jth cycle of the ith battery pack in the BESS; kp is an inherent parameter of the battery pack in the BESS, kp is only related to the battery type.

According to the number of cycles of the battery pack under a specific DOD, the number of cycles of an equivalent loss is determined as follows:

$$N_{expended,j} = \begin{cases} 1 & , j < N_0 \\ j/N_0 & , j \geq N_0 \end{cases},$$

$N_{expended,j}$ is the number of the cycles of the equivalent loss of the jth cycle; When $j<N_0$, each cycle is equivalent to a loss of one cycle; when $j \geq N_0$, the number of cycles of the equivalent loss increases with the increase of j.

S32) A total loss value of the battery pack is obtained based on the number of end-of-life cycles and the number of cycles of the equivalent loss.

During cycles under different DODs, the loss of the battery pack is recorded as:

$$B_{expended,i} = N_{expended,j}/N_{life,i,j},$$

where, i is the sequence number the battery pack; j is the sequence number of the cycle; each cycle corresponds to a DOD, so that a loss value can be calculated.

The total loss of the battery pack is:

$$B_{expended,i} = \sum_{j=1}^{n_i} B_{expended,i,j},$$

where, $n_i$ is the number of cycles of the ith battery pack counted by the rain-flow counting method.

S33) The SOH of the battery pack is obtained based on the total loss of the battery pack.

The SOH of the battery is:

$$SOH_i = 1 - B_{expended,j}.$$

S4) A charging index sequence and a discharging index sequence of the battery packs are obtained based on the SOHs of the battery packs, the SOCs of the battery packs and the charging and discharging states of the battery packs.

The SOCs of all battery packs are calculated, and the SOCs and the SOHs of the battery packs are normalized. All battery packs are grouped according to the charging and discharging state, and all battery packs are numbered based on the normalized SOCs and the normalized SOHs of the battery packs and the charging and discharging states of the battery packs. Then, the charging index sequence and the discharging index sequence of the battery packs are determined according to a descending order.

Specifically, all battery packs are divided into a charging group, a waiting group and a discharging group. The battery packs in the charging state are classified into the charging group; the battery packs in the discharging state are classified into the discharging group; and the battery packs which are not charged and discharged or have completed the charging and discharging are classified into the waiting group.

The SOCs of all battery packs are calculated as follows:

$$SOC_i = \frac{C_i}{C_0 \times SOH_i},$$

where, $SOC_i$ is the SOC of the ith battery pack; $C_i$ is the current capacity of the ith battery pack; and $C_0$ is the standard capacity of the ith battery pack.

The SOHs and the SOCs of all battery packs are normalized as follows:

$$Z_i(SOH) = \frac{SOH_i - SOH_{min}}{SOH_{max} - SOH_{min}},$$

$$Z_i(SOC1) = \frac{SOC_{max} - SOC_i}{SOC_{max} - SOC_{min}},$$

$$Z_i(SOC2) = \frac{SOC_i - SOC_{min}}{SOC_{max} - SOC_{min}},$$

where, $Z_i(SOH)$ is the normalized SOH; the value range of the normalized SOH is [0,1], and increases with the increase of $SOH_i$; both $Z_i(SOC1)$ and $Z_i(SOC2)$ are normalized SOCs; the value ranges of the normalized $Z_i(SOC1)$ and the normalized $Z_i(SOC2)$ are [0,1]; $Z_i(SOC1)$ decreases with the increase of SOC and $Z_i(SOC2)$ increases with the increase of $SOC_i$. In practice, when the SOH of the battery pack is lower than 0.8, it is considered that the battery pack cannot be used continuously, so the battery packs with $SOH_i \in [0.8,1]$ are reserved, and other battery packs that do not meet the condition of $SOH_i \in [0.8,1]$ are discarded.

In order to ensure that the charging sequence is from the charging group to the waiting group, and to the discharging group, constants 2, 1.5 and 0 are added to the value ranges of the charging group, the waiting group, and the discharging group respectively. During charging, charging sequence numbers assigned to all battery packs can be expressed as follows.

The sequence number of the battery pack in the charging group is expressed as $Z_i = Z_i(SOH) + Z_i(SOC1) + 2 \in [2,4].$ The sequence number of the battery pack in the waiting group is expressed as $Z_i = Z_i(SOH) + 1.5 \in [1.5, 2.5].$ The sequence number of the battery pack in the discharging group is expressed as $Z_i = Z_i(SOH) + Z_i(SOC1) \in [0,2].$ During charging, the charging index sequence is determined in a descending order according to the charging sequence number. According to the value ranges of the charging sequence number, it can be known that the charging sequence is from the charging group, to the waiting group, and then to the discharging group in general. The battery pack with a larger SOH in each group has a larger charging sequence number, and the battery pack with a smaller SOC in each group has a larger charging sequence number. The larger sequence number corresponds to a higher charging priority. The charging priority of battery packs which are in different groups and have an overlapped value range is determined by the relationship of SOHs and SOCs in the battery packs. For example, if the SOH and the SOC of a battery pack in the charging group are 0.82 and 0.74 respectively, the calculated charging sequence number of the battery pack is 2.2. While, if the SOH of a battery pack in the waiting group is 0.98, the calculated charging sequence number of the battery pack is 2.4. At this time, the charging priority of the battery pack in the waiting group is higher than that of the battery pack in the charging group. This is because the SOH of the battery pack in the waiting group is much greater than the battery pack in the charging group, and the battery pack in the charging group already has a higher SOC. Thus, the battery pack in the waiting group having a charging sequence number of 2.4 is first charged, and then the battery pack in the charging group having a charging sequence number of 2.2 is charged.

Similarly, during discharging, in order to ensure that the discharging priority is from the discharge group, the waiting group and the charging group from high to low in general, constants 2, 1.5 and 0 are respectively added to the value ranges of the discharging group, the waiting group and the charging group. When discharging, discharging sequence numbers assigned to all battery packs can be expressed as follows.

The sequence number of the battery pack in the charging group is expressed as $Z_i=Z_i(SOH)+Z_i(SOC2)\in[0,2]$.

The sequence number of the battery pack in the waiting group is expressed as $Z_i=Z_i(SOH)+1.5\in[1.5,2.5]$.

The sequence number of the battery pack in the discharging group is expressed as $Z_i=Z_i(SOH)+Z_i(SOC2)+2\in[2,4]$.

During discharging, a discharging index sequence is determined in a descending order according to the discharging sequence number. From the value range of the discharging sequence number, it can be seen that the discharge priority from high to low is generally from the discharge group, the waiting group, and the charging group.

S5) The optimal number of charging and discharging battery packs and the DODs corresponding to the charging and discharging battery packs are obtained based on the number of cycles of each of the battery packs and the DODs corresponding to the cycles of each of the battery packs.

When determining the optimal number of the charging and discharging battery packs and the DODs corresponding to the charging and discharging battery packs, the heuristic algorithm is adopted to carry out the optimization. The heuristic algorithm includes but is not limited to particle swarm algorithm, genetic algorithm, ant colony algorithm, bee colony algorithm, and simulated annealing algorithm. In practice, in order to facilitate the operation, improve the convergence speed of the algorithm, and jump out of the local optimal solution, the particle swarm algorithm is selected to find the optimal number of charging and discharging battery packs and the corresponding optimal DODs.

During the execution of the algorithm, the variable is set as follows. When the number of the battery packs is $n_0$, the variable is the DOD of each battery pack, namely, $x_{n_0}=[DOD_1, DOD_2, \ldots, DOD_{n_0}]$.

Taking the minimum sum of life loss of all battery packs as the objective function, the objective function can be expressed as:

$$\min f(x_{n_0}) = \sum_{i=1}^{n_0} B_{expended,i},$$

where, constraints of the objective function include a constraint for output power, a constraint for the SOC of the battery, a constraint for charging and discharging states, and a constraint for balance of the total electric power.

The constraint for output power is $P_{min} \leq |P_i| \leq P_{max}$, where, $P_{min}, P_{max}$ are a minimum and a maximum of input and output power of each battery pack of the BESS; the minimum of the input and output power is 0, and at this time, the battery pack is not working; the maximum is the rated power of the battery pack, which is an inherent parameter of the battery pack; and $|P_i|$ is the absolute value of the input and output power of the battery pack of the BESS.

The constraint for the SOC of the battery pack is $SOC_{min} \leq SOC_i \leq SOC_{max}$, where, $SOC_{min}$ and $SOC_{max}$ are a maximum and a minimum of the SOC of the battery pack of the BESS; in order to ensure the healthy operation of the BESS, the minimum and the maximum of the SOC are 0.2 and 0.8, respectively. When the SOC reaches the minimum of 0.2, the battery pack in the discharging state will immediately stop discharging and be in the waiting state or charging state. Similarly, the battery pack in the charging state immediately stops charging when the SOC reaches the maximum of 0.8; $SOC_i$ is the SOC of the ith battery pack of the BESS.

The constraint for the charging and discharging states is:

$$I(t) = \begin{cases} 1 & , Batterypackisinachargingstageatmomentt \\ 0 & , Batterypackisinawaitingstageatmomentt \\ -1 & , Batterypackisinadischargingstageatmomentt \end{cases}.$$

The constraint for the total electric power is: $E_i(t+1)=E_i(t)+I(t)\times\Delta E_i(t)$, where, $E_i(t+1)$, $E_i(t)$ are the total electric power (the total electric power is the electric power stored in the battery pack at that time) of the ith battery pack at moment t+1 and moment t respectively; $\Delta E_i(t)$ is the electric power of the ith battery pack transacted at moment t (the transacted electric power is the absolute value of the charge (discharge) electric power of the battery pack at the calculated time).

Figure 2:
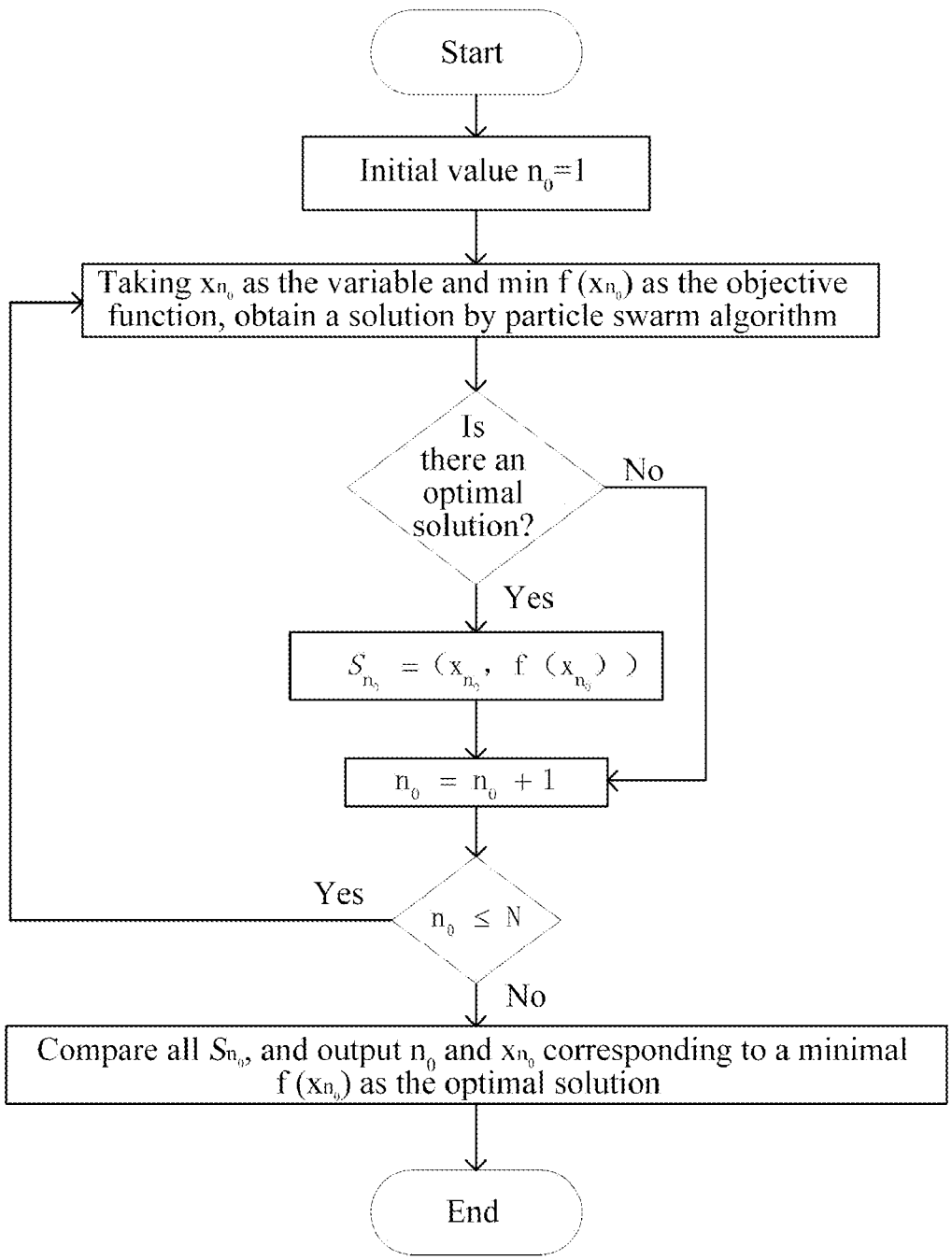
FIG. 2 is a flow chart of a method for finding an optimal number of charging and discharging battery packs and a corresponding DODs corresponding to the charging and discharging battery packs based on the number of cycles of each of the battery packs and the DODs corresponding to the cycles of each of the battery packs using a heuristic algorithm according to an embodiment of the present disclosure.

Referring to FIG. 2, the process of finding the optimal number of the charging and discharging battery packs and the corresponding optimal DODs using the particle swarm algorithm is generally described as follows.

Step 1) $n_0=1$ is taken as an initial value of the number of the battery packs.

Step 2) Taking $x_{n_0}$ as the variable and min $f(x_{n_0})$ as the objective function, a solution is obtained using the particle swarm algorithm. If there is an optimal solution, $s_{n_0}=(x_0,f(x_{n_0}))$ is recorded, and proceed to step 3; otherwise, directly proceed to step 3.

Step 3) Let $n_0=n_0+1$, if $n_0 \leq N$ (N is the total number of battery packs), return to step 2; otherwise, proceed to step 4.

Step 4) All $s_{n_0}$ are compared, and $n_0$ and $x_{n_0}$ corresponding to a minimal $f(x_{n_0})$ are outputted as the optimal solution.

S6) Based on the optimal number of the charging and discharging battery packs and the DODs corresponding to the charging and discharging battery packs, charging and discharging tasks of the battery packs are carried out according to the index sequences.

According to the optimal solution obtained in the above step 4, that is, the optimal number of the charging and discharging battery packs and the DODs corresponding to the charging and discharging battery packs, charging and discharging tasks are carried out according to the determined index sequences. At this time, the total loss of all battery packs is minimal, which allows the BESS to have the longest service life.

Embodiment 2

Figure 3:
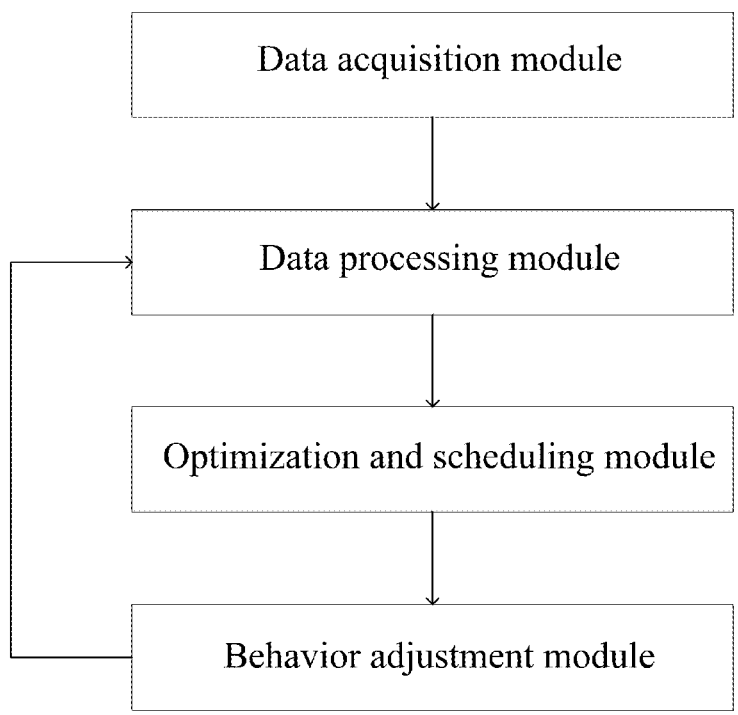
FIG. 3 is a schematic diagram of a system for optimizing charging and discharging behaviors of a BESS based on a SOH according to an embodiment of the present disclosure.

In the second aspect, the present disclosure further proposes a system for optimizing charging and discharging behaviors of a BESS based on SOH. Referring to FIG. 3, the system includes:

a data acquisition module, configured to obtain electric power data;

a data processing module, configured to determine output power of the BESS based on the electric power data, obtain a curve of a SOC of each of the battery packs based on the output power of the BESS, obtain the number of cycles of each of the battery packs and DODs corresponding to the cycles of each of the battery packs based on the curve of the SOC of each of the battery packs, obtain the SOH of each of the battery packs based on the number of cycles of each of the battery packs and the DODs corresponding to the cycles of each of the battery packs, and obtain a charging index sequence and a discharging index sequence of the battery packs based on the SOH, the SOC, charging and discharging states of each of the battery packs;

an optimization and scheduling module, configured to determine the optimal number of charging and discharging battery packs and DODs corresponding to the charging and discharging battery packs based on the number of cycles of each of the battery packs and the DODs corresponding to the cycles of each of the battery packs; and a behavior adjustment module, configured to perform charging and discharging tasks of the battery packs according to the charging index sequence and the discharging index sequence based on the optimal number of the charging and discharging battery packs and the DODs corresponding to the charging and discharging battery packs.

In some embodiments, in the data processing module, the number of cycles of each of the battery packs and the DODs corresponding to the cycles of each of the battery packs are obtained based on the curve of the SOC of each of the battery packs using a cycle counting method, wherein the cycle counting method includes a rain-flow counting method.

In some embodiments, in the data processing module, based on the number of cycles of each of the battery packs and the DODs corresponding to the cycles of each of the battery packs, the SOH of each of the battery packs is obtained through steps that:

31) the number of end-of-life cycles of each of the battery packs under different DODs and the number of cycles of an equivalent loss are obtained based on the number of cycles of each of the battery packs;

32) a total loss value of each of the battery packs is obtained based on the end-of-life cycles and the number of cycles of the equivalent loss; and 33) the SOH of each of the battery packs is obtained based on the total loss value of each of the battery packs.

In some embodiments, in the data processing module, based on the SOH, the SOC and a charging and discharging state of each of the battery packs, the charging index sequence and the discharging index sequence of the battery packs are obtained through steps that:

SOCs of the battery packs are calculated, and the SOCs and SOHs of the battery packs are normalized; and the battery packs are grouped according to the charging and discharging state of each of the battery packs; the battery packs are numbered based on the normalized SOCs and SOHs of the battery packs and the charging and discharging state of each of the battery packs; and the charging index sequence and the discharging index sequence are determined according to numbers of the battery packs in a descending order.

In some embodiments, in the optimization and scheduling module, taking a minimum sum of the life loss value of the battery packs as an objective function, the optimal number of the charging and discharging battery packs and the DODs corresponding to the charging and discharging battery packs are determined based on the number of cycles of each of the battery packs and the DODs corresponding to the cycles of each of the battery packs using a heuristic algorithm.

It should be understood that the system for optimizing charging and discharging behaviors of the BESS based on the SOH corresponds to the method for optimizing charging and discharging behaviors of the BESS based on the SOH illustrated above. The relevant content explanations, examples, and beneficial effects of the charging and discharging optimization system can be referred to the corresponding description in the charging and discharging optimization method, and will not be repeated herein.

In conclusion, compared to the prior art, the present invention has the following beneficial effects.

1. The power data is obtained to determine the output power of the BESS, and the curve of the SOC of each of the battery packs is determined. The number of cycles of each of the battery packs and the DODs corresponding to the cycles of each of the battery packs are obtained according to the historical curve of the SOC of each of the battery packs, and then SOH of each of the battery packs is obtained according to the number of cycles of each of the battery packs and the DODs corresponding to the cycles of each of the battery packs. The charging index sequence and the discharging index sequence of the battery packs are determined through the SOHs of the battery packs, the SOCs of the battery packs and the charging and discharging states of the battery packs. Finally, the optimal number of charging and discharging battery packs and the corresponding optimal DODs are determined, and charging and discharging tasks of the battery packs are carried out according to the optimal number of the charging and discharging battery packs and the optimal DODs, and the index sequences. The technical solutions of the present disclosure comprehensively consider the maximum number of cycles of each of the battery packs, the DOD and the total number of discharge cycles when calculating the SOH of the BESS, which meets the requirements of actual charging and discharging processes. At the same time, the SOH, the SOC, and the charging and discharging states of the battery packs are comprehensively considered when determining the charging index sequence and the discharging index sequence of the battery packs, and finally the charging and discharging tasks are carried out according to the obtained optimal number of the charging and discharging battery packs and the corresponding optimal DODs, and the index sequences, which minimizes the behavior that shortens the service life of the battery, thus realizing the overall optimization of the BESS.

2. In the optimization process, the calculation of the SOH of the battery pack of the BESS not only involves the maximum number of cycles of the battery pack and the DOD of the battery pack, but also considers the number of cycles of an equivalent loss, which complies with the fact that frequent switching of charging and discharging states increases the loss of the battery packs. In this way, the optimization result will be more accurate.

3. The SOH, the SOC, and the charging and discharging state are comprehensively considered when determining the charging and discharging indexes of the battery packs. The charging index is determined based on a sequence of the SOHs of the battery packs from high to low, a sequence of the SOCs of the battery packs from low to high, and a sequence from the charging group, to the waiting group and then to the discharging group. The discharging index is determined based on a sequence of the SOHs of the battery packs from high to low, a sequence of the SOCs of the battery packs from high to low, and a sequence from the discharging group, to the waiting group and then to the charging group. At the same time, the optimal number of the charging and discharging battery packs and the corresponding optimal DODs of the battery packs are determined using the particle swarm algorithm, which avoids the behavior that shortens the service life of the battery to the greatest extent, thus making the optimization more effective.

It should be noted that relational terms such as "first" and "second" are only used to distinguish one entity or operation from another entity or operation, and do not necessarily require or imply any such actual relationship or order between these entities or operations. In addition, terms "include", "comprise" or any other variants thereof are non-exclusive, so a process, method, article or device including a series of elements not only includes those elements, but also includes other elements that are not explicitly listed or inherent elements of the process, method, article or equipment. Unless specified, the element defined by the sentence "including a . . . " does not exclude the existence of other identical elements in the process, method, article, or equipment that includes the element.

The above embodiments are only illustrative of the technical solutions of the present disclosure, but not intended to limit the scope of the present disclosure. Although the present disclosure has been described in detail with reference to the above embodiments, those of ordinary skill in the art should understand that modifications and equivalent replacements can be made based on the technical solutions described in the foregoing embodiments. However, such modifications or replacements shall fall within the spirit and scope of the present disclosure.

What is claimed is:

1. A method for optimizing charging and discharging behaviors of a battery energy storage system (BESS) based on a state of health (SOH), comprising:
    determining an output power of the BESS based on electric power data; and
obtaining a curve of a state of charge (SOC) of each of battery packs based on the output power of the BESS;
    obtaining the number of cycles of each of the battery packs and depths of discharge (DODs) corresponding to the cycles of each of the battery packs based on the curve of the SOC of each of the battery packs;
    obtaining the SOH of each of the battery packs based on the number of cycles of each of the battery packs and the DODs corresponding to the cycles of each of the battery packs;
    obtaining a charging index sequence and a discharging index sequence of the battery packs based on the SOH, the SOC and a charging and discharging state of each of the battery packs;
    determining optimal number of charging and discharging battery packs and DODs corresponding to the battery packs based on the number of cycles of each of the battery packs and the DODs corresponding to the cycles of each of the battery packs; and
    carrying out charging and discharging tasks according to the charging index sequence and the discharging index sequence based on the optimal number of the charging and discharging battery packs and the DODs corresponding to the charging and discharging battery packs.

2. The method of claim 1, wherein the step of "obtaining the number of cycles of each of the battery packs and the DODs corresponding to the cycles of each of the battery packs based on the curve of the SOC of each of the battery packs" comprises:
    obtaining the number of cycles of each of the battery packs and the DODs corresponding to the cycles of each of the battery packs based on the curve of the SOC of each of the battery packs using a cycle counting method, wherein the cycle counting method comprises a rain-flow counting method.

3. The method of claim 1, wherein the step of "obtaining the SOH of each of the battery packs based on the number of cycles of each of the battery packs and the DOD corresponding to the cycles of each of the battery packs" comprises:
    obtaining the number of end-of-life cycles of each of the battery packs under different DODs and the number of cycles of an equivalent loss based on the number of cycles of each of the battery packs;
    obtaining a total loss value of each of the battery packs based on the end-of-life cycles and the number of cycles of the equivalent loss; and
    obtaining the SOH of each of the battery packs based on the total loss value of each of the battery packs.

4. The method of claim 1, wherein the step of "obtaining the charging index sequence and the discharging index sequence of the battery packs based on the SOH, the SOC and a charging and discharging state of each of the battery packs" comprises:
    calculating SOCs of the battery packs, and normalizing the SOCs and SOHs of the battery packs;
    grouping the battery packs according to the charging and discharging state of each of the battery packs; and numbering the battery packs based on the normalized SOCs and SOHs of the battery packs and the charging and discharging state of each of the battery packs; and
    determining the charging index sequence and the discharging index sequence according to numbers of the battery packs in a descending order.

5. The method of claim 1, wherein the step of "determining the optimal number of the charging and discharging battery packs and DODs corresponding to the charging and discharging battery packs based on the number of cycles of each of the battery packs and the DODs corresponding to the cycles of each of the battery packs" comprises:
    taking a minimum sum of the life loss value of the battery packs as an objective function, determining the optimal number of the charging and discharging battery packs and the DODs corresponding to the charging and discharging battery packs based on the number of cycles of each of the battery packs and the DODs corresponding to the cycles of each of the battery packs using a heuristic algorithm.

6. A system for optimizing charging and discharging behaviors of a BESS based on SOH, comprising:
    a data acquisition module, configured to acquire electric power data;
    a data processing module, configured to determine an output power of the BESS based on the electric power data, obtain a curve of a SOC of each of the battery packs based on the output power of the BESS, obtain the number of cycles of each of the battery packs and DODs corresponding to the cycles of each of the battery packs based on the curve of the SOC of each of the battery packs, obtain the SOH of each of the battery packs based on the number of cycles of each of the battery packs and the DODs corresponding to the cycles of each of the battery packs, and obtain a charging index sequence and a discharging index sequence of the battery packs based on the SOH, the SOC, a charging and discharging state of each of the battery packs;
    an optimization and scheduling module, configured to determine the optimal number of charging and discharging battery packs and DODs corresponding to the charging and discharging battery packs based on the number of cycles of each of the battery packs and the DODs corresponding to the cycles of each of the battery packs; and a behavior adjustment module, configured to perform charging and discharging tasks of the battery packs respectively according to the charging index sequence and the discharging index sequence based on the optimal number of the charging and discharging battery packs and the DODs corresponding to the charging and discharging battery packs.

7. The system of claim 6, wherein in the data processing module, the number of cycles of each of the battery packs and the DODs corresponding to the cycles of each of the battery packs are obtained based on the curve of the SOC of each of the battery packs using a cycle counting method, wherein the cycle counting method comprises a rain-flow counting method.

8. The system of claim 6, wherein in the data processing module, based on the number of cycles of each of the battery packs and the DODs corresponding to the cycles of each of the battery packs, the SOH of each of the battery packs is obtained through steps that:
   the number of life-end cycles of each of the battery packs under different DODs and the number of cycles of an equivalent loss are obtained based on the number of cycles of each of the battery packs;
   a total loss value of each of the battery packs is obtained based on the end-of-life cycles and the number of cycles of the equivalent loss; and
   the SOH of each of the battery packs is obtained based on the total loss value of each of the battery packs.

9. The system of claim 6, wherein in the data processing module, based on the SOH, the SOC and a charging and discharging state of each of the battery packs, the charging index sequence and the discharging index sequence of the battery packs are obtained through steps that:
   SOCs of the battery packs are calculated, and the SOCs and SOHs of the battery packs are normalized; and
   the battery packs are grouped according to the charging and discharging state of each of the battery packs; the battery packs are numbered based on the normalized SOCs and SOHs of the battery packs and the charging and discharging state of each of the battery packs; and
   the charging index sequence and the discharging index sequence are determined according to numbers of the battery packs in a descending order.

10. The system of claim 6, wherein in the optimization and scheduling module, the optimal number of the charging and discharging battery packs and DODs corresponding to the charging and discharging battery packs are determined based on the number of cycles of each of the battery packs and the DODs corresponding to the cycles of each of the battery packs using a heuristic algorithm with a minimum sum of the life loss value of the battery packs as an objective function.

* * * * *